(12) United States Patent
Shakya et al.

(10) Patent No.: US 11,740,282 B1
(45) Date of Patent: Aug. 29, 2023

(54) APPARATUSES AND METHODS FOR MONITORING HEALTH OF PROBING U-BUMP CLUSTER USING CURRENT DIVIDER

(71) Applicant: Intel Corporation, Santa Clara, CA (US)

(72) Inventors: Jagat Shakya, Hillsboro, OR (US); Joseph Parks, Jr., Portland, OR (US); Ethan Caughey, Hillsboro, OR (US); Ashwin Ashok, Hillsboro, OR (US); Prasanna Thiyagasundaram, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/709,483

(22) Filed: Mar. 31, 2022

(51) Int. Cl.
*G01R 31/20* (2006.01)
*G01R 31/28* (2006.01)
*G01R 1/073* (2006.01)
*G01R 1/04* (2006.01)

(52) U.S. Cl.
CPC ....... *G01R 31/2891* (2013.01); *G01R 1/0483* (2013.01); *G01R 1/07314* (2013.01); *G01R 31/2853* (2013.01); *G01R 31/2886* (2013.01); *G01R 31/2887* (2013.01); *H01L 2924/00* (2013.01); *H01L 2924/01006* (2013.01); *H01L 2924/01033* (2013.01)

(58) Field of Classification Search
CPC ............ G01R 31/2891; G01R 1/07314; G01R 31/2853; G01R 31/2886; G01R 31/2887; G01R 1/0483; H01L 2924/00; H01L 2924/01006; H01L 2924/01033
USPC ......... 324/71, 378, 403, 415, 425, 500, 537, 324/750.16, 750.25
See application file for complete search history.

(56) References Cited

U.S. PATENT DOCUMENTS

| | | | |
|---|---|---|---|
| 2006/0109014 A1* | 5/2006 | Chao ............... | G01R 31/2884 324/762.05 |
| 2020/0124664 A1* | 4/2020 | Sim .................. | G01R 1/07314 |
| 2020/0309850 A1* | 10/2020 | Bismuth ........... | G01R 31/2891 |

* cited by examiner

*Primary Examiner* — Raul J Rios Russo
(74) *Attorney, Agent, or Firm* — VIERING, JENTSCHURA&PARTNER MBB

(57) ABSTRACT

An apparatus includes an input probe configured to be placed on a first cluster of u-bumps disposed on a semiconductor die, output probes configured to be respectively placed on multiple clusters of u-bumps disposed on the semiconductor die, the multiple clusters being separately connected to the first cluster. The apparatus further includes a space transformer and printed circuit board (PCB) portion including a current source configured to supply a current to the input probe placed on the first cluster, resistors having a same resistance and being connected to ground, and tester channels at which voltages are respectively measured, the tester channels being respectively connected to ends of the output probes respectively placed on the multiple clusters and being respectively connected to the resistors. The apparatus further includes a processor configured to determine whether the input probe is properly aligned with the first cluster, based on the measured voltages.

20 Claims, 7 Drawing Sheets

US 11,740,282 B1

APPARATUSES AND METHODS FOR MONITORING HEALTH OF PROBING U-BUMP CLUSTER USING CURRENT DIVIDER

BACKGROUND

Fine pitch assembly with 2.5-dimensional (2.5D) and 3-dimensional (3D) die stacking architecture may require solder-to-solder u-bump connection between top and bottom dies. 2.5D and 3D die assembly may allow die disaggregation, which provides the flexibility of assembling different chiplets from multiple sources and multiple technologies on the same base die.

To provide enough power during sort/test probing, u-bumps may need to be probed in clusters. Probes may be typically aligned with the u-bumps, using an optical alignment referred to as probe-to-pad alignment (PTPA). Alignment of a probe to a center of a cluster may be key to deliver optimal power and signal and to prevent probing-induced damage, thus improving a yield of a product.

However, except for gross issues, misalignments may be typically discovered after manual inspection under a microscope for known issues, which may require time, equipment and human resources. The misalignments may even go unnoticed and be discovered only after packaging, which may result in a huge yield loss. The misalignments may also be discovered after the fact, and may not be monitored in-situ.

BRIEF DESCRIPTION OF THE DRAWINGS

In the drawings, like reference characters generally refer to the same parts throughout the different views. The drawings are not necessarily to scale, emphasis instead generally being placed upon illustrating the present disclosure. The dimensions of the various features or elements may be arbitrarily principles expanded or reduced for clarity. In the following description, various aspects of the present disclosure are described with reference to the following drawings, in which.

DETAILED DESCRIPTION

Figure 1A:
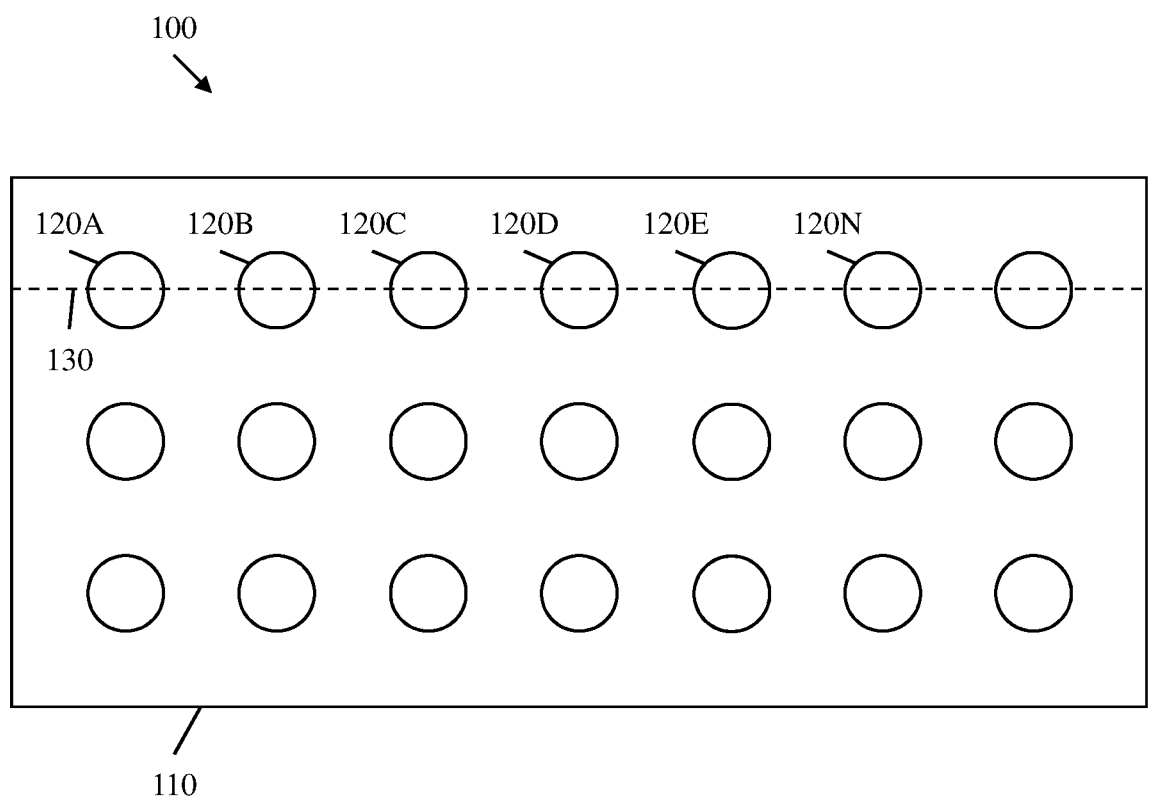
FIG. 1A is a plan view of a semiconductor device to be stacked.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to apparatuses and methods for monitoring health of probing a u-bump cluster, using a current divider.

A present apparatus may include an input probe configured to be placed on a first cluster of u-bumps disposed on a semiconductor die, output probes configured to be respectively placed on multiple clusters of u-bumps disposed on the semiconductor die, the multiple clusters being separately connected to the first cluster. The apparatus may further include a space transformer and printed circuit board (PCB) portion including a current source configured to supply a current to the input probe placed on the first cluster, resistors having a same resistance and being connected to ground, and tester channels at which voltages are respectively measured, the tester channels being respectively connected to ends of the output probes respectively placed on the multiple clusters and being respectively connected to the resistors. The apparatus may further include a processor configured to determine whether the input probe is properly aligned with the first cluster, based on the measured voltages.

In another aspect, a method pursuant to the present disclosure may include controlling an input probe to be placed on a first cluster of u-bumps disposed on a semiconductor die, controlling output probes to be respectively placed on multiple clusters of u-bumps disposed on the semiconductor die, the multiple clusters being separately connected to the first cluster, and controlling a current source to supply a current to the input probe placed on the first cluster. The method may further include measuring voltages respectively at tester channels respectively connected to ends of the output probes respectively placed on the multiple clusters, and respectively connected to resistors having a same resistance and being connected to ground, and determining whether the input probe is properly aligned with the first cluster, based on the measured voltages.

In yet another aspect, a non-transitory computer-readable medium may include instructions, which, if executed by a processor, cause the processor to control an input probe to be placed on a first cluster of u-bumps disposed on a semiconductor die, control output probes to be respectively placed on multiple clusters of u-bumps disposed on the semiconductor die, the multiple clusters being separately connected to the first cluster, and control a current source to supply a current to the input probe placed on the first cluster. The instructions, which, if executed by the processor, may further cause the processor to measure voltages respectively at tester channels respectively connected to ends of the output probes respectively placed on the multiple clusters, and respectively connected to resistors having a same resistance and being connected to ground, and determine whether the input probe is properly aligned with the first cluster, based on the measured voltages.

The above-detailed aspects may use direct current (DC) through each u-bump in a u-bump cluster as a proxy to a probe-to-bump overlap area, when a probe lands on the u-bump cluster, to test the u-bump cluster. The overlap area may then be used to determine a health of probing the u-bump cluster, e.g., whether the probe is properly aligned with the u-bump cluster.

Further, each individual u-bump in the u-bump cluster may be routed to different nearby u-bump clusters connected in series to known resistors. A known current may be forced through the probe to the u-bump cluster in question. A voltage drop across each of the known resistors may be utilized to calculate a current through each u-bump in the u-bump cluster and hence the probe-to-bump overlap area.

Advantageously, such u-bump cluster probing may enable 2.5D and 3D die stacking with a die sort. Without this architecture, a dedicated sort pad may be needed, which may consume u-bump real estate and reduce a package power delivery. Also, there may be a chance that misaligned probing damages a u-bump and results in a poor yield.

FIG. 1A is a plan view of a semiconductor device 100 to be stacked.

Referring to FIG. 1A, the semiconductor device 100 includes a semiconductor die 110, and a u-bump cluster 120 or micro-bump cluster disposed on the semiconductor die 110. The u-bump cluster 120 may include u-bumps 120A, 120B, 120C, 120D, 120E, . . . and 120N. Each of the u-bumps 120A-120N may include a Cu pillar, Cu and solder (e.g., SnAg, SnInAg, and/or SnAgCu), Cu, Ni and solder, and/or Cu, Ni, Cu and solder.

Figure 1B:
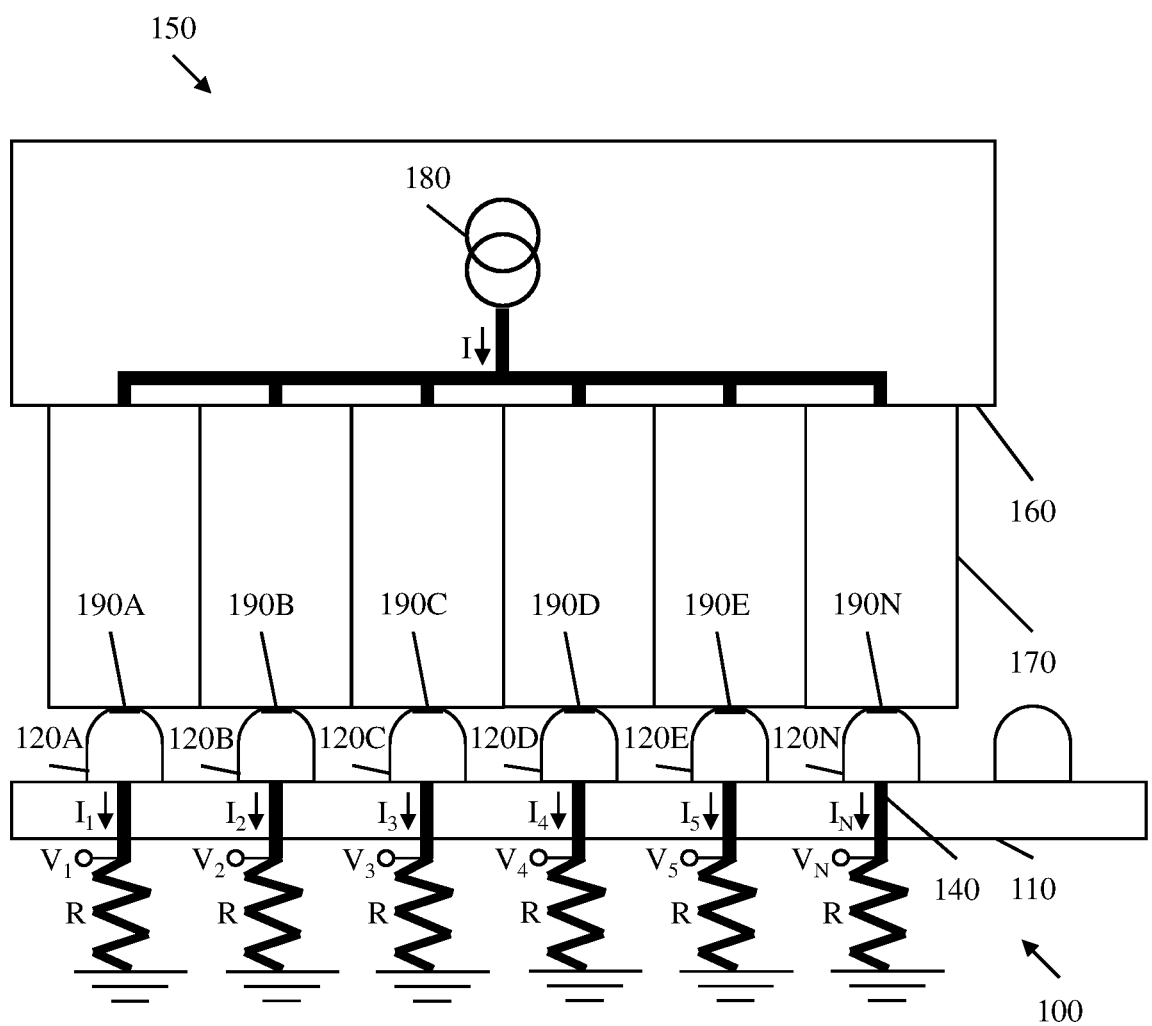
FIG. 1B is a cross-sectional circuit diagram of probing the u-bump cluster, along a line of FIG. 1A, according to aspects of the present disclosure.

FIG. 1B is a cross-sectional circuit diagram of probing the u-bump cluster 120, along a line 130 of FIG. 1A, according to aspects of the present disclosure.

Referring to FIG. 1B, the semiconductor device 100 further includes a conductive metal interconnect 140 under and connected to the u-bumps 120A-120N included in the u-bump cluster 120. Although not shown, the conductive metal interconnect 140 may connect all of the u-bumps 120A-120N to each other.

The probing of the u-bump cluster 120 is performed by a probing device 150, which includes a space transformer and printed circuit board (PCB) portion 160 and one probe 170. The space transformer and PCB portion 160 is a multi-layer stack structure that performs signal routing for the probe 170, and includes a current source 180 outputting a current I.

The probing of the u-bump cluster 120 includes placing portions of the probe 170 respectively on multiple u-bumps (e.g., the u-bumps 120A-120N) of the same net, to test the u-bumps. The probe 170 may include, for example, alloys of Cu, Ag, Au, Pd, Rd, Be, and/or Ni, e.g., a high conductivity material having high mechanical strength and chemical resistance. The net may be a particular power, ground, or signal, e.g., the current I. In this example, the current source 180 is connected to each of the portions of the probe 170 so that each of the portions of the probe 170 respectively transfers the current I to the u-bumps 120A-120N.

An alignment of the probe 170 to each of the u-bumps 120A-120N may change from one touchdown to another touchdown, due to alignment margins of the probe 170. Accordingly, a contact area at which the probe 170 contacts or overlaps each of the u-bumps 120A-120N may also change. The u-bumps 120A-120N may contact the probe 170 at contact areas 190A, 190B, 190C, 190D, 190E, . . . and 190N, respectively, which may be different in size.

If the total current I is forced through the probe 170, depending upon the contact areas 190A-190N, each of the u-bumps 120A-120N may receive and carry a different part of the total current I. The u-bumps 120A-120N may respectively receive and carry currents $I_1, I_2, I_3, I_4, I_5, \ldots$ and $I_N$. The following continuity relation for the total current I may hold:

$$=I_1+I_2+I_3+I_4+I_5+\ldots I_N. \quad (1).$$

A contact resistance between the probe 170 and each of the u-bumps 120A-120N is inversely proportional to the contact area 190A, 190B, 190C, 190D, 190E, . . . or 190N between the probe 170 and a respective one of the u-bumps 120A-120N. That is, a larger contact area results in a smaller contact resistance and a larger current, provided remaining circuit elements are identical.

Thus, by knowing the currents $I_1$-$I_N$ respectively through the individual u-bumps 120A-120N, information about the contact areas 190A-190N between the probe 170 and the u-bumps 120A-120N may be determined. Based on this determined information, a misalignment (e.g., lack of health) of the probe 170 with any of the u-bumps 120A-120N may be advantageously detected.

To know the currents $I_1$-$I_N$ respectively through the u-bumps 120A-120N, a current divider may be used, in which each of the u-bumps 120A-120N is connected in series to ground through a respective portion of the conductive metal interconnect 140 and a respective one of resistors having an identical resistance R, as conceptually shown in FIG. 1B. A voltage across each of the resistors may be measured using a respective one of tester channels, e.g., output nodes.

If $V_1, V_2, V_3, V_4, V_5, \ldots$ and $V_N$ are voltages respectively across the identical resistors connected to the u-bumps 120A-120N, then the corresponding currents $I_1$-$I_N$ may be found using the following relations:

$$I_1=V_1/R;$$

$$I_2=V_2/R;$$

$$\ldots$$

$$I_N=V_N/R. \quad (2)$$

Figure 2A:
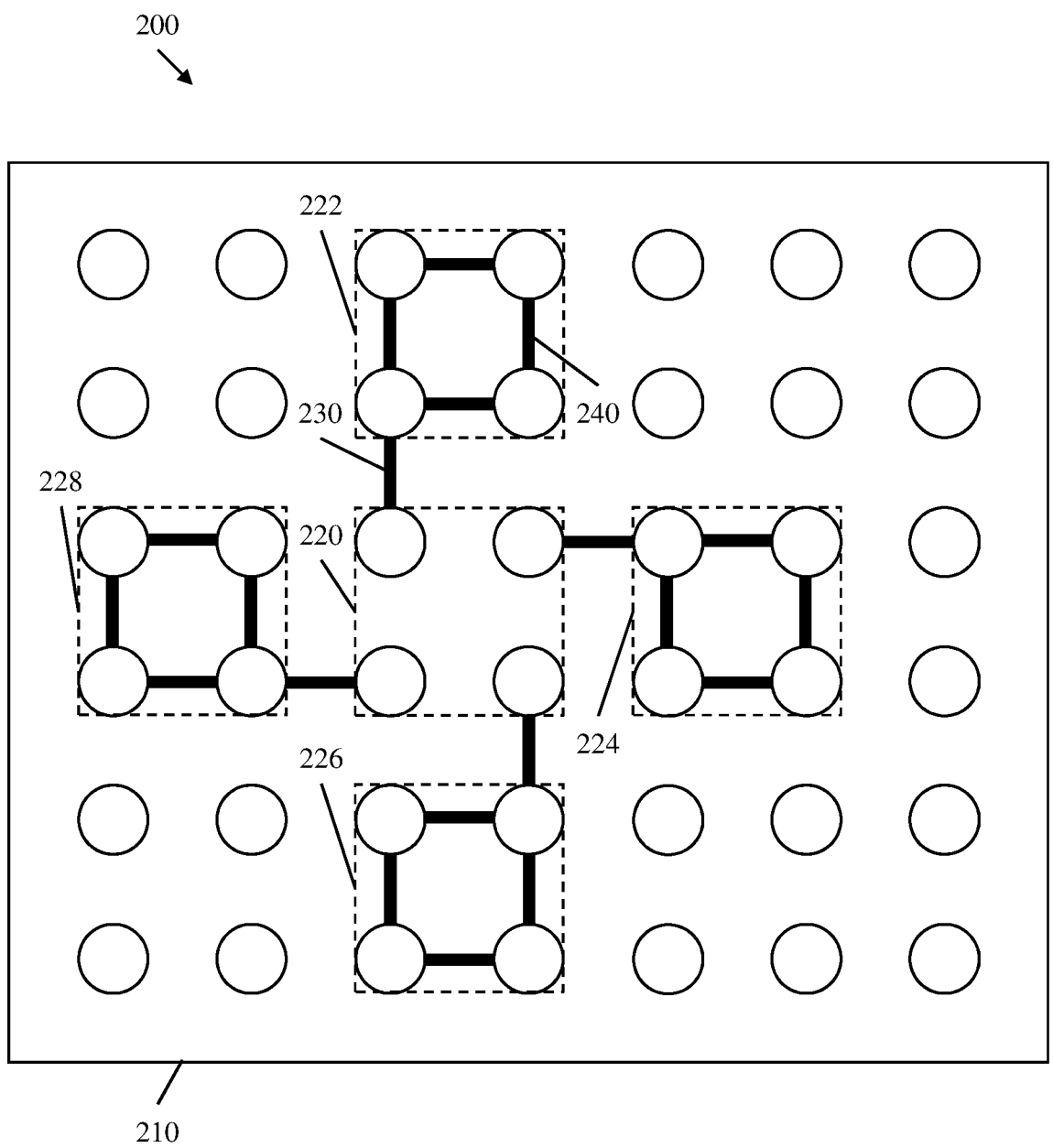
FIG. 2A is a plan view of a semiconductor device to be stacked, according to aspects of the present disclosure.
Figure 2B:
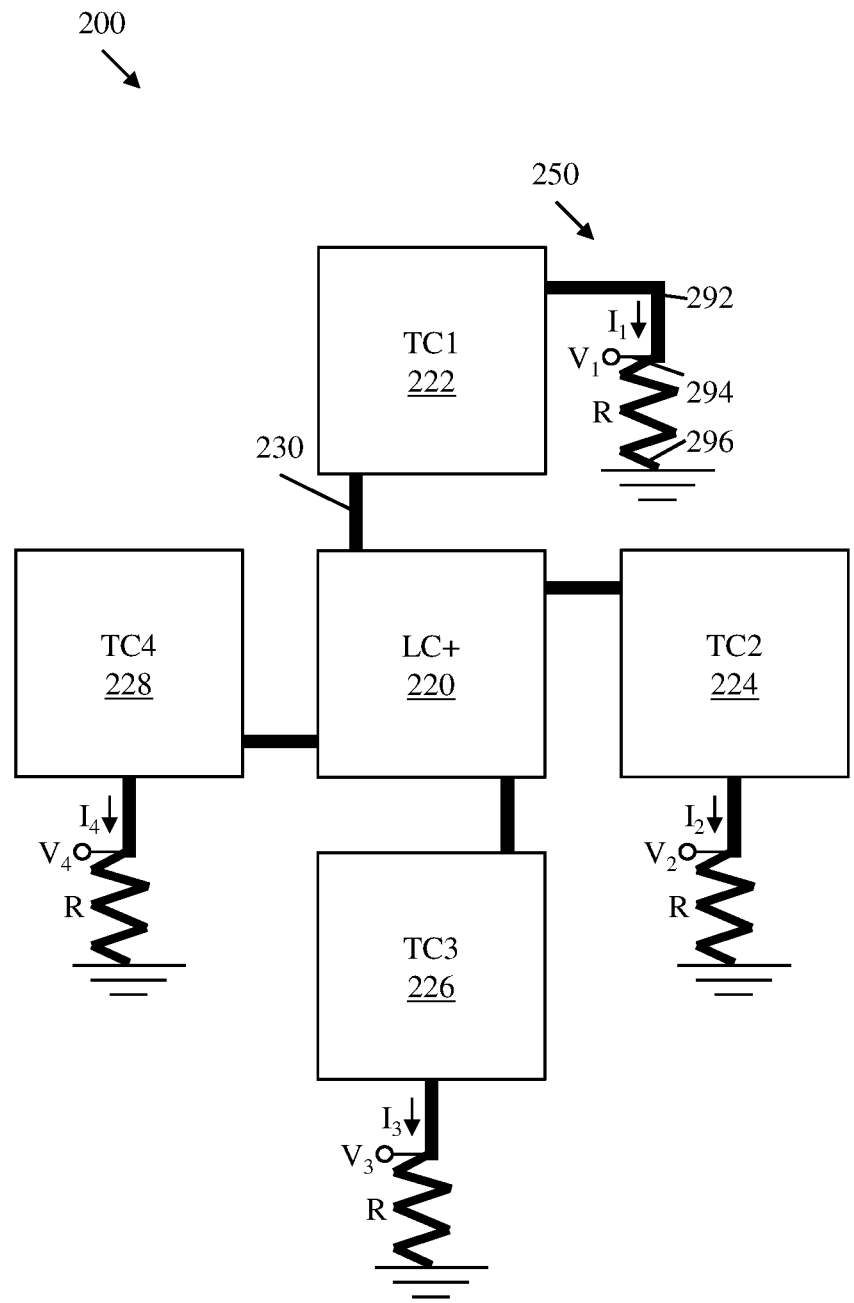
FIG. 2B is a plan view circuit diagram of an apparatus for monitoring health of probing a u-bump cluster included in the semiconductor device of FIG. 2A.
Figure 2C:
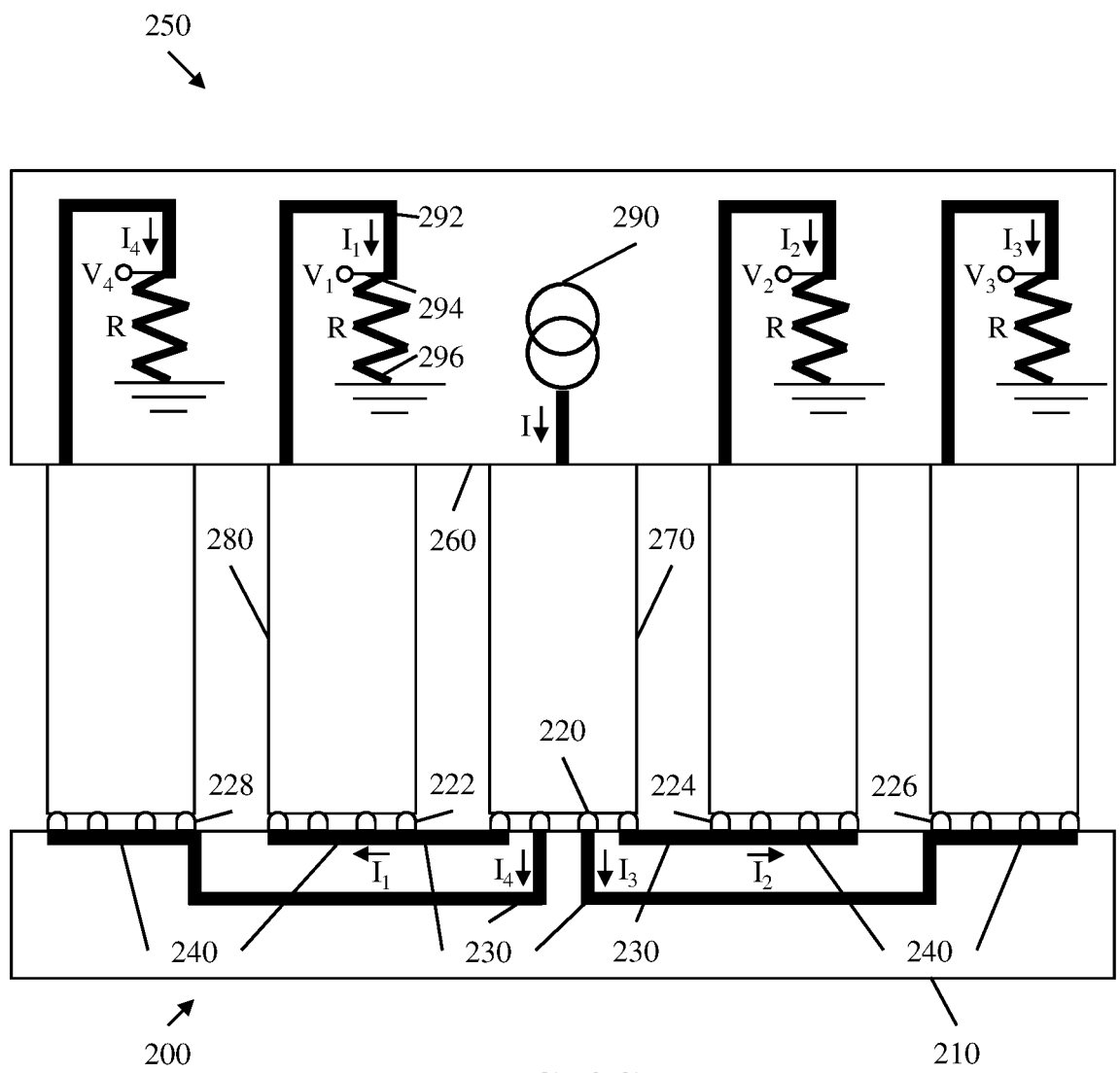
FIG. 2C is a cross-sectional circuit diagram of the apparatus of FIG. 2B.

FIG. 2A is a plan view of a semiconductor device 200 to be stacked, according to aspects of the present disclosure. FIG. 2B is a plan view circuit diagram of an apparatus 250 for monitoring health of probing a u-bump cluster 220 included in the semiconductor device 200 of FIG. 2A. FIG. 2C is a cross-sectional circuit diagram of the apparatus 250 of FIG. 2B.

Referring to FIG. 2A, the semiconductor device 200 includes a semiconductor die 210, the u-bump cluster 220 disposed on the semiconductor die 210, u-bump clusters 222, 224, 226 and 228 also disposed on the semiconductor die 210, and conductive metal interconnects 230 and 240 disposed on and/or in the semiconductor die 210.

The u-bump cluster 220 includes 4 u-bumps belonging to the same net corresponding to a low current power supply. Accordingly, the u-bump cluster 220 may be referred to as LC+. Each of the u-bumps included in the u-bump cluster 220 is connected to a u-bump included in a respective one of u-bump clusters 222, 224, 226 and 228 by a respective one of the conductive metal interconnects 230.

Each of the u-bump clusters 222, 224, 226 and 228 includes 4 u-bumps that are daisy chained together by respective ones of the conductive metal interconnects 240. The u-bump clusters 222, 224, 226 and 228 may respectively be referred to as a tester channel 1 (TC1), a tester channel 2 (TC2), a tester channel 3 (TC3) and a tester channel 4 (TC4). Each of the u-bump clusters 220, 222, 224, 226 and 228 may be probed by a respective one of 5 probes to test the u-bump cluster 220, as follows.

Referring to FIGS. 2B and 2C, the apparatus 250 includes a space transformer and PCB portion 260, an input probe 270 and output probes 280. The space transformer and PCB portion 260 is a multi-layer stack structure that performs signal routing for the input probe 270 and the output probes 280, and includes a current source 290, conductive metal interconnects 292, tester channels 294 and resistors 296.

The apparatus 250 is a current divider for monitoring the health of the probing of the u-bump cluster 220 (LC+) for testing the u-bump cluster 220. The current source 290 outputs a current I of, e.g., 200 milliamperes (mA) ISVM (current source voltage measure). The current source 290 is connected to the input probe 270 so that the input probe 270 transfers the current I to the u-bump cluster 220.

Each of the u-bumps included in the u-bump cluster 220 is connected to the u-bumps included in a respective one of u-bump clusters 222, 224, 226 and 228 (TC1-TC4) by a respective one of the conductive metal interconnects 230. Accordingly, the total current I is divided into currents $I_1$-$I_4$ that are respectively transferred through the conductive metal interconnects 230 and 240, the u-bump clusters 222, 224, 226 and 228 and the output probes 280 and then back to the space transformer and PCB portion 260.

Each of the u-bump clusters 222, 224, 226 and 228 and their respective output probes 280 (e.g., distal ends of the output probes 280) are connected in series to ground through a respective one of the conductive metal interconnects 292 and a respective one of the resistors 296 having an identical resistance R, e.g., of 10 ohms. A voltage across each of the resistors 296 may be measured using a respective one of the tester channels 294. As a result, for the u-bump clusters 222, 224, 226 and 228, respective voltages $V_1$-$V_4$ across the resistors 296 may be measured using the tester channels 294.

If the input probe 270 is equally in contact with all of the u-bumps included in the u-bump cluster 220, each of the u-bumps would receive 50 mA from the input probe 270, hence the voltage measured at each of the tester channels 294 would be 0.5 volts (V). This is an ideal case in which the contact between the input probe 270 and each of the u-bumps included in the u-bump cluster 220 is all good. If the voltage measured at each of the tester channels 294 is not 0.5 V, then the input probe 270 may not be landing with equal overlap on each of the u-bumps included in the u-bump cluster 220. This is due to misalignment as the input probe 270 is designed to land evenly on each of the u-bumps included in the u-bump cluster 220. This electric feedback of the voltage measured at each of the tester channels 294 may be in-situ, and a corrective action (e.g., realignment of the input probe 270 on the u-bump cluster 220) may advantageously be taken to obtain a desired result in which the voltage measured at each of the tester channels 294 is 0.5 V.

In another example, if the input probe 270 is equally in contact with all of the u- bumps included in the u-bump cluster 220, except for those at edges and/or corners of the u-bump cluster 220 at which the contact with the input probe 270 may be lesser in area, each of the u-bumps may receive, from the input probe 270, a predetermined expected value of current, among the total current, e.g., 200 mA. In this example, center u-bumps included in the u-bump cluster 220 may receive 50 mA from the input probe 270, while edge u-bumps included in the u-bump cluster 220 may receive 40 mA from the input probe 270. Hence the ideal voltage measured at each of the tester channels 294 corresponding to the center u-bumps would be 0.5 V, while the ideal voltage measured at each of the tester channels 294 corresponding to the edge u-bumps would be 0.4 V.

Although each of the u-bump clusters 220, 222, 224, 226 and 228 is shown here to include 4 u-bumps, each of the u-bump clusters 220, 222, 224, 226 and 228 may include any number of u-bumps. Similarly, although 5 probes are used herein, N+1 probes may be used, N being a number of u-bumps in a u-bump cluster to be tested. In particular, one input probe may probe the u-bump cluster to be tested, and N output probes may respectively probe N u-bump clusters respectively connected to the N u-bumps in the u-bump cluster to be tested.

Figure 3:
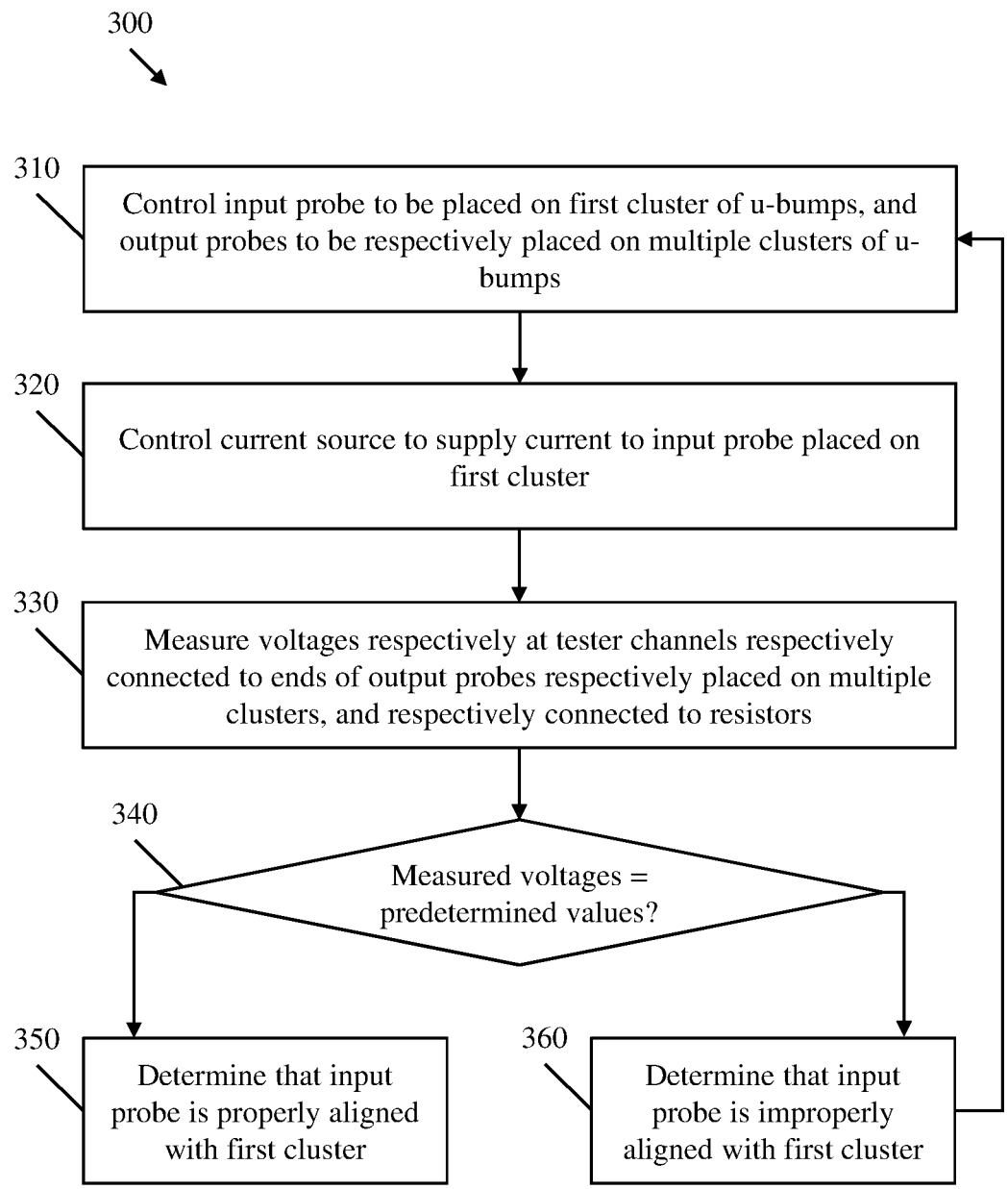
FIG. 3 is a flow diagram of a method of monitoring health of probing a u-bump cluster, using a current divider, according to aspects of the present disclosure.

FIG. 3 is a flow diagram of a method 300 of monitoring health of probing a u-bump cluster, using a current divider, according to aspects of the present disclosure.

Referring to FIG. 3, in operation 310, the method 300 includes controlling an input probe to be placed on a first cluster of u-bumps disposed on a semiconductor die, and controlling output probes to be respectively placed on multiple clusters of u-bumps disposed on the semiconductor die, the multiple clusters being separately connected to the first cluster. For example, the input and output probes may be controlled via a robotic positioning system.

In operation 320, the method 300 includes controlling a current source to supply a current to the input probe placed on the first cluster. For example, the current source may be included in a space transformer and PCB portion.

In operation 330, the method 300 includes measuring voltages respectively at tester channels respectively connected to ends of the output probes respectively placed on the multiple clusters, and respectively connected to resistors having a same resistance and being connected to ground. For example, the voltages may be measured via a voltmeter, and the tester channels and resistors may be included in the space transformer and PCB portion.

In operation 340, the method 300 includes determining whether the measured voltages respectively correspond to predetermined values. Based on the measured voltages being determined to respectively correspond to the predetermined values, the method 300 continues in operation 350. Otherwise, the method 300 continues in operation 360. The measured voltages may be determined to respectively correspond to the predetermined values when the measured voltages are determined to be equal to each other.

In operation 350, the method 300 includes determining that the input probe is properly aligned with the first cluster, and the method 300 ends.

In operation 360, the method 300 includes determining that the input probe is improperly aligned with the first cluster, and method 300 returns to operation 310 for realignment of the input probe on the first cluster.

The methods and sequence of steps presented above are intended to be examples for monitoring health of probing a u-bump cluster, using a current divider, according to aspects of the present disclosure. It will be apparent to those ordinary skilled practitioners that the foregoing process operations may be modified without departing from the spirit of the present disclosure.

Figure 4:
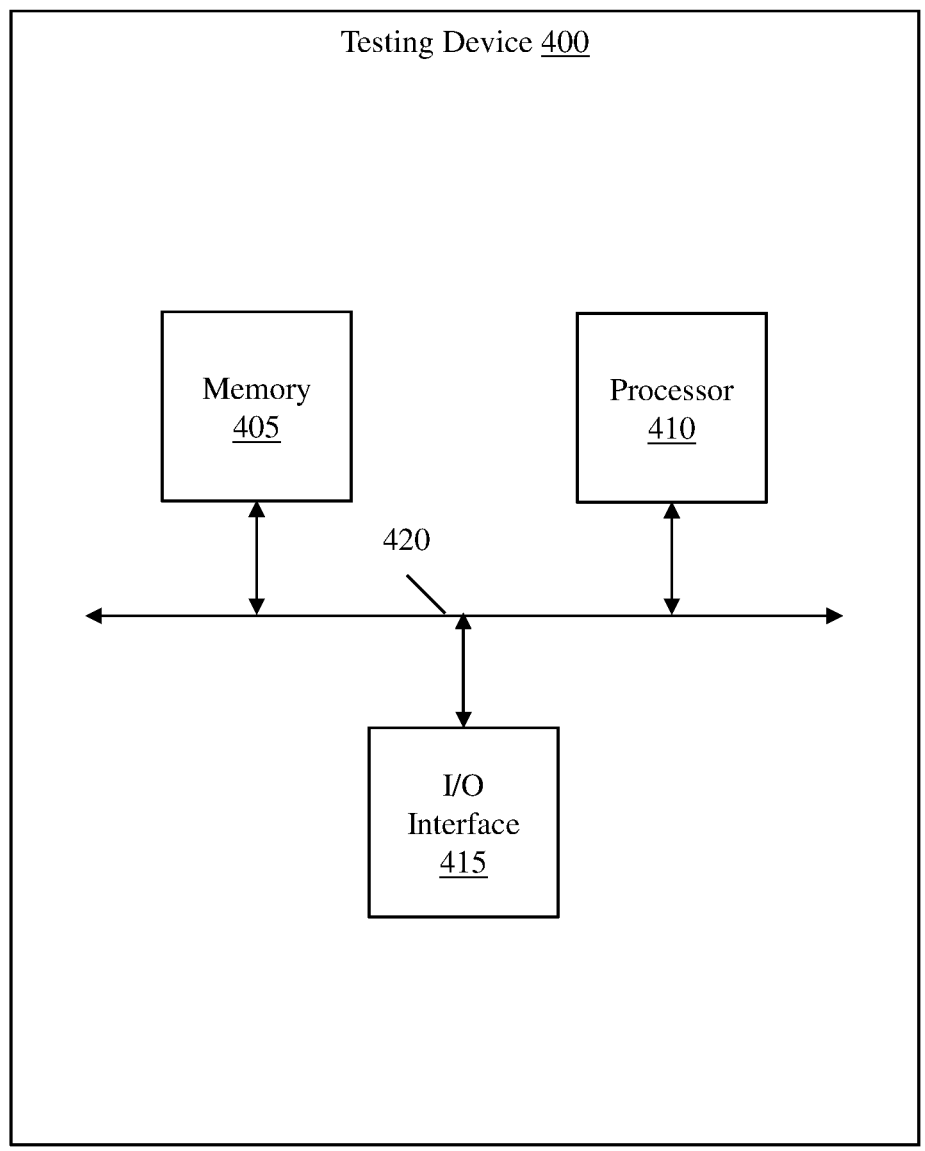
FIG. 4 is a block diagram of a testing device for performing the method of FIG. 3.

FIG. 4 is a block diagram of a testing device 400 for performing the method of FIG. 3.

Referring to FIG. 4, the testing device 400 may include a memory 405, a processor 410, an input/output (I/O) interface 415 and a bus 420.

The memory 405 may include a volatile and/or non-volatile memory. The memory 405 can store information, such as one or more of commands, data, programs (one or more instructions), applications, etc., which are related to at least one other component of the testing device 400 and for driving and controlling the testing device 400. For example, commands and/or data may formulate an operating system (OS). Information stored in the memory 405 can be executed by the processor 410. The memory 405 may store the information that is executed by the processor 410 to perform functions and operations described with respect to FIGS. 1A-3 above.

The processor 410 may include one or more of a central processing unit (CPU), a graphics processor unit (GPU), an accelerated processing unit (APU), a many integrated core (MIC), a field-programmable gate array (FPGA), and/or a digital signal processor (DSP). The processor 410 can be a general-purpose controller that performs control of any one or any combination of the other components of the testing device 400, and/or performs an operation or data processing relating to communication. The processor 410 may execute one or more programs stored in the memory 405.

The I/O interface 415 may serve as a hardware and/or software interface that can, for example, transfer commands and/or data between a user, other external devices and/or other components of the testing device 400. The I/O interface 415 can further set up communication between the testing device 400 and an external testing device. The I/O interface 415 may be connected to a network through wireless or wired communication architecture to communicate with the external testing device. The I/O interface 415 may be a wired or wireless transceiver or any other component for transmitting and receiving signals.

The bus 420 may include a circuit for connecting the components 405, 410 and 415 with one another. The bus 420 functions as a communication system for transferring data between the components 405, 410 and 415 or between testing devices.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including an input probe configured to be placed on a first cluster of u-bumps disposed on a semiconductor die, output probes configured to be respectively placed on multiple clusters of u-bumps disposed on the semiconductor die, the multiple clusters being separately connected to the first cluster. The apparatus further includes a space transformer and printed circuit board (PCB) portion including a current source configured to supply a current to the input probe placed on the first cluster, resistors having a same resistance and being connected to ground, and tester channels at which voltages are respectively measured, the tester channels being respectively connected to ends of the output probes respectively placed on the multiple clusters and being respectively connected to the resistors. The apparatus further includes a processor configured to determine whether the input probe is properly aligned with the first cluster, based on the measured voltages.

Example 2 may include the apparatus of example 1 and/or any other example disclosed herein, for which the processor may be further configured to determine whether the measured voltages respectively correspond to predetermined values.

Example 3 may include the apparatus of example 2 and/or any other example disclosed herein, for which the processor may be further configured to, based on the measured voltages being determined to respectively correspond to the predetermined values, determine that the input probe is properly aligned with the first cluster.

Example 4 may include the apparatus of example 2 and/or any other example disclosed herein, for which the processor may be further configured to, based on the measured voltages being determined to not respectively correspond to the predetermined values, determine that the input probe is improperly aligned with the first cluster.

Example 5 may include the apparatus of example 2 and/or any other example disclosed herein, for which the processor may be further configured to, based on the measured voltages being determined to not respectively correspond to the predetermined values, control the input probe to be realigned on the first cluster.

Example 6 may include the apparatus of example 2 and/or any other example disclosed herein, for which the measured voltages may be determined to respectively correspond to the predetermined values when the measured voltages are determined to be equal to each other.

Example 7 may include the apparatus of example 1 and/or any other example disclosed herein, for which a first one of the multiple clusters may be connected to a first u-bump of the first cluster, and a second one of the multiple clusters may be connected to a second u-bump of the first cluster.

Example 8 provides a method including controlling an input probe to be placed on a first cluster of u-bumps disposed on a semiconductor die, controlling output probes to be respectively placed on multiple clusters of u-bumps disposed on the semiconductor die, the multiple clusters being separately connected to the first cluster, and controlling a current source to supply a current to the input probe placed on the first cluster. The method further includes measuring voltages respectively at tester channels respectively connected to ends of the output probes respectively placed on the multiple clusters, and respectively connected to resistors having a same resistance and being connected to ground, and determining whether the input probe is properly aligned with the first cluster, based on the measured voltages.

Example 9 may include the method of example 8 and/or any other example disclosed herein, for which the determining whether the input probe is properly aligned with the first cluster may include determining whether the measured voltages respectively correspond to predetermined values.

Example 10 may include the method of example 9 and/or any other example disclosed herein, for which the determining whether the input probe is properly aligned with the first cluster may further include, based on the measured voltages being determined to respectively correspond to the predetermined values, determining that the input probe is properly aligned with the first cluster.

Example 11 may include the method of example 9 and/or any other example disclosed herein, for which the determining whether the input probe is properly aligned with the first cluster further may further include, based on the measured voltages being determined to not respectively correspond to the predetermined values, determining that the input probe is improperly aligned with the first cluster.

Example 12 may include the method of example 9 and/or any other example disclosed herein, further including, based on the measured voltages being determined to not respectively correspond to the predetermined values, controlling the input probe to be realigned on the first cluster.

Example 13 may include the method of example 9 and/or any other example disclosed herein, for which the measured voltages may be determined to respectively correspond to the predetermined values when the measured voltages are determined to be equal to each other.

Example 14 may include the method of example 8 and/or any other example disclosed herein, for which a first one of the multiple clusters may be connected to a first u-bump of the first cluster, and a second one of the multiple clusters may be connected to a second u-bump of the first cluster.

Example 15 provides a non-transitory computer-readable medium including instructions, which, if executed by a processor, cause the processor to control an input probe to be placed on a first cluster of u-bumps disposed on a semiconductor die, control output probes to be respectively placed on multiple clusters of u-bumps disposed on the semiconductor die, the multiple clusters being separately connected to the first cluster, and control a current source to supply a current to the input probe placed on the first cluster. The instructions, which, if executed by the processor, further cause the processor to measure voltages respectively at tester channels respectively connected to ends of the output probes respectively placed on the multiple clusters, and respectively connected to resistors having a same resistance and being connected to ground, and determine whether the input probe is properly aligned with the first cluster, based on the measured voltages.

Example 16 may include the non-transitory computer-readable medium of example 15 and/or any other example disclosed herein, for which the instructions, which, if executed by the processor, may further cause the processor to determine whether the measured voltages respectively correspond to predetermined values.

Example 17 may include the non-transitory computer-readable medium of example 16 and/or any other example disclosed herein, for which the instructions, which, if executed by the processor, may further cause the processor to, based on the measured voltages being determined to respectively correspond to the predetermined values, determine that the input probe is properly aligned with the first cluster.

Example 18 may include the non-transitory computer-readable medium of example 16 and/or any other example disclosed herein, for which the instructions, which, if executed by the processor, may further cause the processor to, based on the measured voltages being determined to not respectively correspond to the predetermined values, determine that the input probe is improperly aligned with the first cluster.

Example 19 may include the non-transitory computer-readable medium of example 16 and/or any other example disclosed herein, for which the instructions, which, if executed by the processor, may further cause the processor to, based on the measured voltages being determined to not respectively correspond to the predetermined values, control the input probe to be realigned on the first cluster.

Example 20 may include the non-transitory computer-readable medium of example 16 and/or any other example disclosed herein, for which the measured voltages may be determined to respectively correspond to the predetermined values when the measured voltages are determined to be equal to each other.

Example 21 provides an apparatus including first controlling means for controlling an input probe to be placed on a first cluster of u-bumps disposed on a semiconductor die, and controlling output probes to be respectively placed on multiple clusters of u-bumps disposed on the semiconductor die, the multiple clusters being separately connected to the first cluster. The apparatus further includes second controlling means for controlling a current source to supply a current to the input probe placed on the first cluster, measuring means for measuring voltages respectively at tester channels respectively connected to ends of the output probes respectively placed on the multiple clusters, and respectively connected to resistors having a same resistance and being connected to ground, and determining means for determining whether the input probe is properly aligned with the first cluster, based on the measured voltages.

Example 22 may include the apparatus of example 21 and/or any other example disclosed herein, for which the determining means may further be for determining whether the measured voltages respectively correspond to predetermined values.

Example 23 may include the apparatus of example 22 and/or any other example disclosed herein, for which the determining means may further be for, based on the measured voltages being determined to respectively correspond to the predetermined values, determining that the input probe is properly aligned with the first cluster.

Example 24 may include the apparatus of example 22 and/or any other example disclosed herein, for which the determining means may further be for, based on the measured voltages being determined to not respectively correspond to the predetermined values, determining that the input probe is improperly aligned with the first cluster.

Example 25 may include the apparatus of example 22 and/or any other example disclosed herein, for which the first controlling means may further be for, based on the measured voltages being determined to not respectively correspond to the predetermined values, controlling the input probe to be realigned on the first cluster.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
   an input probe configured to be placed on a first cluster of u-bumps disposed on a semiconductor die;
   output probes configured to be respectively placed on multiple clusters of u-bumps disposed on the semiconductor die, the multiple clusters being separately connected to the first cluster;
   a space transformer and printed circuit board (PCB) portion comprising:
   a current source configured to supply a current to the input probe placed on the first cluster;
   resistors having a same resistance and being connected to ground; and
   tester channels at which voltages are respectively measured, the tester channels being respectively connected to ends of the output probes respectively placed on the multiple clusters and being respectively connected to the resistors; and
   a processor configured to determine whether the input probe is properly aligned with the first cluster, based on the measured voltages.

2. The apparatus of claim 1, wherein the processor is further configured to determine whether the measured voltages respectively correspond to predetermined values.

3. The apparatus of claim 2, wherein the processor is further configured to, based on the measured voltages being determined to respectively correspond to the predetermined values, determine that the input probe is properly aligned with the first cluster.

4. The apparatus of claim 2, wherein the processor is further configured to, based on the measured voltages being determined to not respectively correspond to the predetermined values, determine that the input probe is improperly aligned with the first cluster.

5. The apparatus of claim 2, wherein the processor is further configured to, based on the measured voltages being determined to not respectively correspond to the predetermined values, control the input probe to be realigned on the first cluster.

6. The apparatus of claim 2, wherein the measured voltages are determined to respectively correspond to the predetermined values when the measured voltages are determined to be equal to each other.

7. The apparatus of claim 1, wherein a first one of the multiple clusters is connected to a first u-bump of the first cluster, and
   a second one of the multiple clusters is connected to a second u-bump of the first cluster.

8. A method comprising:
   controlling an input probe to be placed on a first cluster of u-bumps disposed on a semiconductor die;
   controlling output probes to be respectively placed on multiple clusters of u-bumps disposed on the semiconductor die, the multiple clusters being separately connected to the first cluster;
   controlling a current source to supply a current to the input probe placed on the first cluster;
   measuring voltages respectively at tester channels respectively connected to ends of the output probes respectively placed on the multiple clusters, and respectively connected to resistors having a same resistance and being connected to ground; and
   determining whether the input probe is properly aligned with the first cluster, based on the measured voltages.

9. The method of claim 8, wherein the determining whether the input probe is properly aligned with the first cluster comprises determining whether the measured voltages respectively correspond to predetermined values.

10. The method of claim 9, wherein the determining whether the input probe is properly aligned with the first cluster further comprises, based on the measured voltages being determined to respectively correspond to the predetermined values, determining that the input probe is properly aligned with the first cluster.

11. The method of claim 9, wherein the determining whether the input probe is properly aligned with the first cluster further comprises, based on the measured voltages being determined to not respectively correspond to the predetermined values, determining that the input probe is improperly aligned with the first cluster.

12. The method of claim 9, further comprising, based on the measured voltages being determined to not respectively correspond to the predetermined values, controlling the input probe to be realigned on the first cluster.

13. The method of claim 9, wherein the measured voltages are determined to respectively correspond to the predetermined values when the measured voltages are determined to be equal to each other.

14. The method of claim 8, wherein a first one of the multiple clusters is connected to a first u-bump of the first cluster, and
    a second one of the multiple clusters is connected to a second u-bump of the first cluster.

15. A non-transitory computer-readable medium comprising instructions, which, if executed by a processor, cause the processor to:
    control an input probe to be placed on a first cluster of u-bumps disposed on a semiconductor die;
    control output probes to be respectively placed on multiple clusters of u-bumps disposed on the semiconductor die, the multiple clusters being separately connected to the first cluster;
    control a current source to supply a current to the input probe placed on the first cluster;
    measure voltages respectively at tester channels respectively connected to ends of the output probes respectively placed on the multiple clusters, and respectively connected to resistors having a same resistance and being connected to ground; and
    determine whether the input probe is properly aligned with the first cluster, based on the measured voltages.

16. The non-transitory computer-readable medium of claim 15, wherein the instructions, which, if executed by the processor, further cause the processor to determine whether the measured voltages respectively correspond to predetermined values.

17. The non-transitory computer-readable medium of claim 16, wherein the instructions, which, if executed by the processor, further cause the processor to, based on the measured voltages being determined to respectively correspond to the predetermined values, determine that the input probe is properly aligned with the first cluster.

18. The non-transitory computer-readable medium of claim 16, wherein the instructions, which, if executed by the processor, further cause the processor to, based on the measured voltages being determined to not respectively correspond to the predetermined values, determine that the input probe is improperly aligned with the first cluster.

19. The non-transitory computer-readable medium of claim 16, wherein the instructions, which, if executed by the processor, further cause the processor to, based on the measured voltages being determined to not respectively correspond to the predetermined values, control the input probe to be realigned on the first cluster.

20. The non-transitory computer-readable medium of claim 16, wherein the measured voltages are determined to respectively correspond to the predetermined values when the measured voltages are determined to be equal to each other.

* * * * *